United States Patent
Nishida et al.

(10) Patent No.: US 10,690,318 B2
(45) Date of Patent: Jun. 23, 2020

(54) LED APPARATUS AND MANUFACTURING METHOD THEREOF

(71) Applicant: SAMSUNG ELECTRONICS CO., LTD., Suwon-si (KR)

(72) Inventors: Yasuhiro Nishida, Seongnam-si (KR); Dae-sik Kim, Suwon-si (KR); Tetsuya Shigeta, Suwon-si (KR); Ji-Hoon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 15/646,804

(22) Filed: Jul. 11, 2017

(65) Prior Publication Data

US 2018/0245773 A1    Aug. 30, 2018

(30) Foreign Application Priority Data

Feb. 24, 2017    (KR) .................. 10-2017-0024667

(51) Int. Cl.
| | |
|---|---|
| *F21V 9/00* | (2018.01) |
| *F21V 9/30* | (2018.01) |
| *F21V 9/08* | (2018.01) |
| *F21V 5/04* | (2006.01) |
| *F21V 11/00* | (2015.01) |

(Continued)

(52) U.S. Cl.
CPC ............. *F21V 9/30* (2018.02); *F21V 5/004* (2013.01); *F21V 5/007* (2013.01); *F21V 5/04* (2013.01); *F21V 9/08* (2013.01); *F21V 11/00* (2013.01); *H01L 33/44* (2013.01); *H01L 33/504* (2013.01); *H01L 33/58* (2013.01)

(58) Field of Classification Search
CPC ... F21V 9/30; F21V 9/08; F21V 11/02; F21V 11/06; F21V 5/007; F21V 5/004; F21V 11/00; F21V 5/04; H01L 25/0753; H01L 33/504; H01L 33/44; H01L 33/58; H04N 9/30; H04N 5/58; F21Y 2115/10; G02B 5/20; G02B 5/22; G02B 5/223; G02B 5/201; G02B 5/003

See application file for complete search history.

(56) References Cited

U.S. PATENT DOCUMENTS

| | | |
|---|---|---|
| 4,827,118 A | 5/1989 | Shibata et al. |
| 5,958,610 A | 9/1999 | Yonekawa et al. |

(Continued)

FOREIGN PATENT DOCUMENTS

| | | |
|---|---|---|
| JP | 2000-029406 A | 1/2000 |
| JP | 2002-358033 A | 12/2002 |

(Continued)

*Primary Examiner* — Y M. Quach Lee
(74) *Attorney, Agent, or Firm* — Sughrue Mion, PLLC

(57) ABSTRACT

A light emitting diode (LED) apparatus is provided. The LED apparatus includes: an LED layer including a plurality of LEDs corresponding to a plurality of sub-pixels; a phosphor layer which is stacked on a top of the LED layer and includes a phosphor corresponding to at least a part of the plurality of sub-pixels; and a filter layer which is stacked on a top of the phosphor layer and includes a plurality of color filters corresponding to the plurality of sub-pixels, and each of the plurality of color filters includes a plurality of absorption films which are spaced from one another at predetermined intervals to absorb external light.

19 Claims, 26 Drawing Sheets

(51) Int. Cl.
  *F21V 5/00*   (2018.01)
  *H01L 33/50*   (2010.01)
  *H01L 33/58*   (2010.01)
  *H01L 33/44*   (2010.01)

(56) References Cited

U.S. PATENT DOCUMENTS

| | | | |
|---|---|---|---|
| 2007/0228965 A1* | 10/2007 | Cha | G02B 3/0031 |
| | | | 313/110 |
| 2008/0078733 A1 | 4/2008 | Nearman et al. | |
| 2009/0273745 A1* | 11/2009 | Liu | G02B 5/201 |
| | | | 349/106 |
| 2011/0215701 A1* | 9/2011 | Tong | F21K 9/00 |
| | | | 313/46 |
| 2013/0122422 A1* | 5/2013 | Kwon | G03F 7/027 |
| | | | 430/281.1 |
| 2016/0190105 A1* | 6/2016 | Rhee | H01L 25/0753 |
| | | | 257/76 |
| 2017/0287887 A1* | 10/2017 | Takeya | H01L 25/0753 |

FOREIGN PATENT DOCUMENTS

| | | |
|---|---|---|
| KR | 10-2010-0103697 A | 9/2010 |
| WO | 2009/091610 A1 | 7/2009 |

\* cited by examiner

FIG. 7D

|  | xy | u'v' |
|---|---|---|
| POW w Blue Cut Filter | 87.1% | 87.1% |
| POW w CF + WLO | 106.1% | 113.4% |

FIG. 8D

|  | xy | u'v' |
|---|---|---|
| POW w Blue Cut Filter | 87.1% | 87.2% |
| POW w CF + WLO | 109.6% | 125.8% |

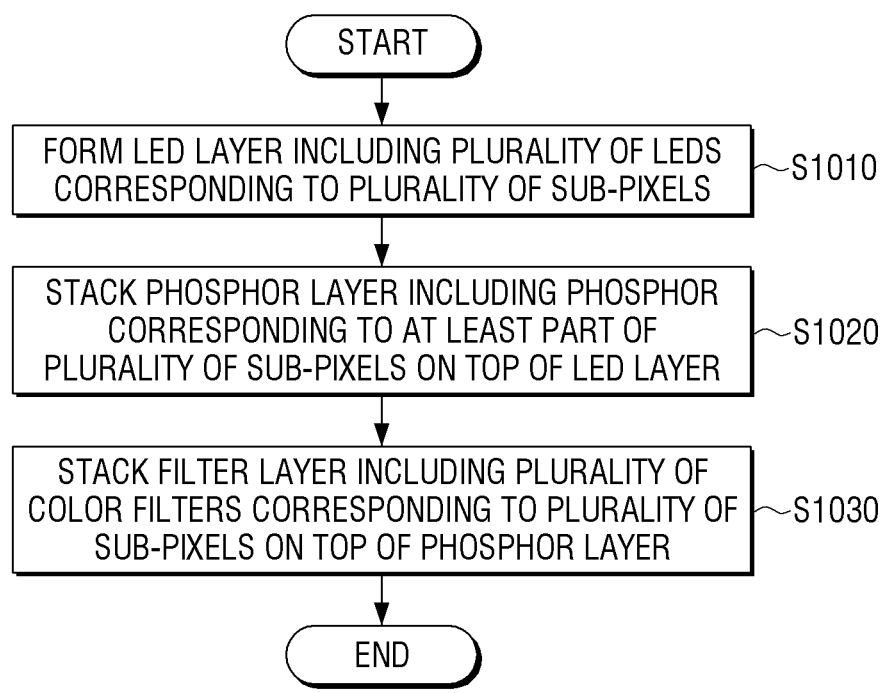

LED APPARATUS AND MANUFACTURING METHOD THEREOF

CROSS-REFERENCE TO RELATED APPLICATION(S)

This application claims priority from Korean Patent Application No. 10-2017-0024667, filed on Feb. 24, 2017, in the Korean Intellectual Property Office, the disclosure of which is incorporated herein by reference in its entirety.

BACKGROUND

Field

Apparatuses and methods consistent with exemplary embodiments relate to a light emitting diode (LED) apparatus and a manufacturing method thereof, and more particularly, to an LED apparatus which can emit light of red, green, and blue and can be used as a pixel, and a manufacturing method thereof.

Description of the Related Art

A light emitting diode (LED) display is expected to be utilized not only in the field of signage but also in the field of television or cinema. However, since the LED display uses three types of LEDs (e.g., red/green/blue LEDs) in one pixel, about 6,000,000 LEDs are required to implement a display of full high definition (FHD) image quality, and thus there is a problem that the unit cost of production increases.

Accordingly, in order to reduce the unit cost of production, a method of using only one type of an LED (for example, a blue LED) and using a red phosphor for red and a green phosphor for green has been developed. However, this method has a problem that a color gamut becomes narrow. In addition, the LED display has disadvantages of a large reflection of external light and a poor contrast.

Therefore, there is a demand for an LED display which can ensure a wide color gamut and enhance a contrast, while reducing the unit cost of production.

SUMMARY

One or more exemplary embodiments may overcome the above disadvantages and other disadvantages not described above. However, it is understood that one or more exemplary embodiments are not required to overcome the disadvantages described above, and may not overcome any of the problems described above.

One or more exemplary embodiments provide a light emitting diode (LED) apparatus which can emit light of red, green, and blue, and in particular, can reduce an influence of a reflection of external light and enhance a contrast, and a manufacturing method thereof.

According to an aspect of an exemplary embodiment, there is provided an LED apparatus including: an LED layer including a plurality of LEDs corresponding to a plurality of sub-pixels; a phosphor layer which is stacked on a top of the LED layer and includes a phosphor corresponding to at least a part of the plurality of sub-pixels; and a filter layer which is stacked on a top of the phosphor layer and includes a plurality of color filters corresponding to the plurality of sub-pixels. Each of the plurality of color filters may include a plurality of absorption films which are spaced from one another at predetermined intervals to absorb external light. Therefore, the plurality of color filters may allow only the light of a wavelength corresponding to the sub-pixels to pass therethrough, such that a contrast can be enhanced. A structure using a phosphor layer shows better external light absorption efficiency than a structure which has a filter layer directly formed on the top of an LED layer without a phosphor layer.

By additionally forming the filter layer, light of a wavelength which does not correspond to each sub-pixel in e entering light may be absorbed, and only the light of a wavelength corresponding to each sub-pixel is passed, such that a contrast can be enhanced.

The LED apparatus may further include a lenticular lens layer including a plurality of lenticular lens units which are stacked on tops of the plurality of color filters, and each of the plurality of lenticular lens units may include a plurality of lenticular lenses. The plurality of lenticular lenses may be arranged to correspond to a plurality of filter regions divided by the plurality of absorption films and to refract the external light toward the plurality of absorption films.

In addition, the LED apparatus may further include a blocking layer which includes a plurality of blocking films connected with the plurality of absorption films in a vertical direction and formed on a top of the filter layer, and each of the plurality of blocking films may be formed on a part of each of a plurality of filter regions, which are divided by the plurality of absorption films, at a predetermined interval, and may absorb light of a wavelength which does not correspond to each sub-pixel and allow light of a wavelength corresponding to each sub-pixel to pass therethrough, such that a contrast can be enhanced. The blocking films may be formed of a material for absorbing light.

The LED apparatus may further include a micro lens layer which includes a plurality of micro lens units formed on a top of the blocking layer to correspond to the plurality of color filters, and each of the plurality of micro lens units may include a plurality of micro lenses. The plurality of micro lenses may be arranged to correspond to the plurality of blocking films and to refract the external light toward the plurality of blocking films.

The phosphor layer may include a first phosphor which is stacked on a top of an LED corresponding an R sub-pixel from among the plurality of LEDs, and emits light including an R component, and a second phosphor which is stacked on a top of an LED corresponding to a G sub-pixel from among the plurality of LEDs, and emits light including a G component.

In addition, the plurality of color filters may include a first color filter which is stacked on a top of the first phosphor, a second color filter which is stacked on a top of the second phosphor, and a third color filter which is formed on a top of an LED corresponding to a B sub-pixel from among the plurality of LEDs.

The phosphor may be configured to correspond to an R sub-pixel and a G sub-pixel from among the plurality of LEDs, and emit light including an R component and a G component. The LED apparatus may further include a blue cut filter which is disposed on a region of the G sub-pixel between the phosphor layer and the filter layer, and the blue cut filter may be configured to filter a B component out of light emitted from the phosphor.

In addition, the LED apparatus may further include an absorbing dye layer which is disposed on a region of the R sub-pixel between the phosphor layer and the filter layer, and the absorbing dye layer may be configured to absorb a wavelength component between the R component and the G component in light emitted from the phosphor.

In addition, the phosphor may be configured to convert light entering from the plurality of LEDs into a wavelength of a corresponding sub-pixel, and disperse the light of the converted wavelength outwardly through an inner dispersing member.

According to another aspect of an exemplary embodiment, there is provided a method for manufacturing an LED apparatus, the method including: forming an LED layer including a plurality of LEDs corresponding to a plurality of sub-pixels; stacking, on a top of the LED layer, a phosphor layer including a phosphor corresponding to at least a part of the plurality of sub-pixels; and stacking, on a top of the phosphor layer, a filter layer including a plurality of color filters corresponding to the plurality of sub-pixels, wherein each of the plurality of color filters includes a plurality of absorption films which are spaced from one another at predetermined intervals to absorb external light.

The method may further include stacking, on tops of the plurality of color filters, a plurality of lenticular lens units. Each of the plurality of lenticular lens units may include a plurality of lenticular lenses, and the plurality of lenticular lenses may be arranged to correspond to a plurality of filter regions divided by the plurality of absorption films and to refract the external light toward the plurality of absorption films.

The method may further include forming a blocking layer which includes a plurality of blocking films connected with the plurality of absorption films in a vertical direction and formed on a top of the filter layer, and each of the plurality of blocking films may be formed on a part of each of the plurality of filter regions, which are divided by the plurality of absorption films, at a predetermined interval to block the external light.

The method may further include stacking, on a top of the blocking layer, a plurality of micro lens units formed to correspond to the plurality of color filters. Each of the plurality of micro lens units may include a plurality of micro lenses, and the plurality of micro lenses may be arranged to correspond to the plurality of blocking films and to refract the external light toward the plurality of blocking films.

The stacking the phosphor layer may include: stacking, on a top of an LED corresponding an R sub-pixel from among the plurality of LEDs, a first phosphor emitting light including an R component; and stacking, on a top of an LED corresponding to a G sub-pixel from among the plurality of LEDs, a second phosphor emitting light including a G component.

The stacking the filter layer may include: stacking a first color filter on a top of the first phosphor; stacking a second color filter on a top of the second phosphor; and forming a third color filter on a top of an LED corresponding to a B sub-pixel from among the plurality of LEDs.

The phosphor may be configured to correspond to an R sub-pixel and a G sub-pixel from among the plurality of LEDs, and emit light including an R component and a G component. The method may further include stacking a blue cut filter which is disposed on a region of the G sub-pixel between the phosphor layer and the filter layer, and the blue cut filter may be configured to filter a B component out of light emitted from the phosphor.

The method may further include stacking an absorbing dye layer which is disposed on a region of the R sub-pixel between the phosphor layer and the filter layer, and the absorbing dye layer may be configured to absorb a wavelength component between the R component and the G component in light emitted from the phosphor.

In addition, the phosphor may be configured to convert light entering from the plurality of LEDs into a wavelength of a corresponding sub-pixel, and disperse the light of the converted wavelength outwardly through an inner dispersing member.

According to various exemplary embodiments described above, external light entering the LED apparatus can be blocked or absorbed, such that the contrast of the LED apparatus can be enhanced.

Additional and/or other aspects and advantages of the exemplary embodiments will be set forth in part in the description which follows and, in part, will be obvious from the description, or may be learned by practice of the exemplary embodiments.

BRIEF DESCRIPTION OF THE DRAWING FIGURES

The above and/or other aspects will be more apparent by describing certain exemplary embodiments with reference to the accompanying drawings, in which:

FIGS. 7A to 7D are views to illustrate color gamuts according to whether a color filter and a blue cut filter are used according to an exemplary embodiment;

FIGS. 8A to 8D are views to illustrate color gamuts according to whether a color filter, a blue cut filter, and an absorbing dye layer are used according to an exemplary embodiment;

FIG. 10 is a flowchart to illustrate a method of manufacturing an LED apparatus according to an exemplary embodiment.

DETAILED DESCRIPTION

Hereinafter, various exemplary embodiments will be described in detail with reference to the accompanying drawings.

Figure 1:
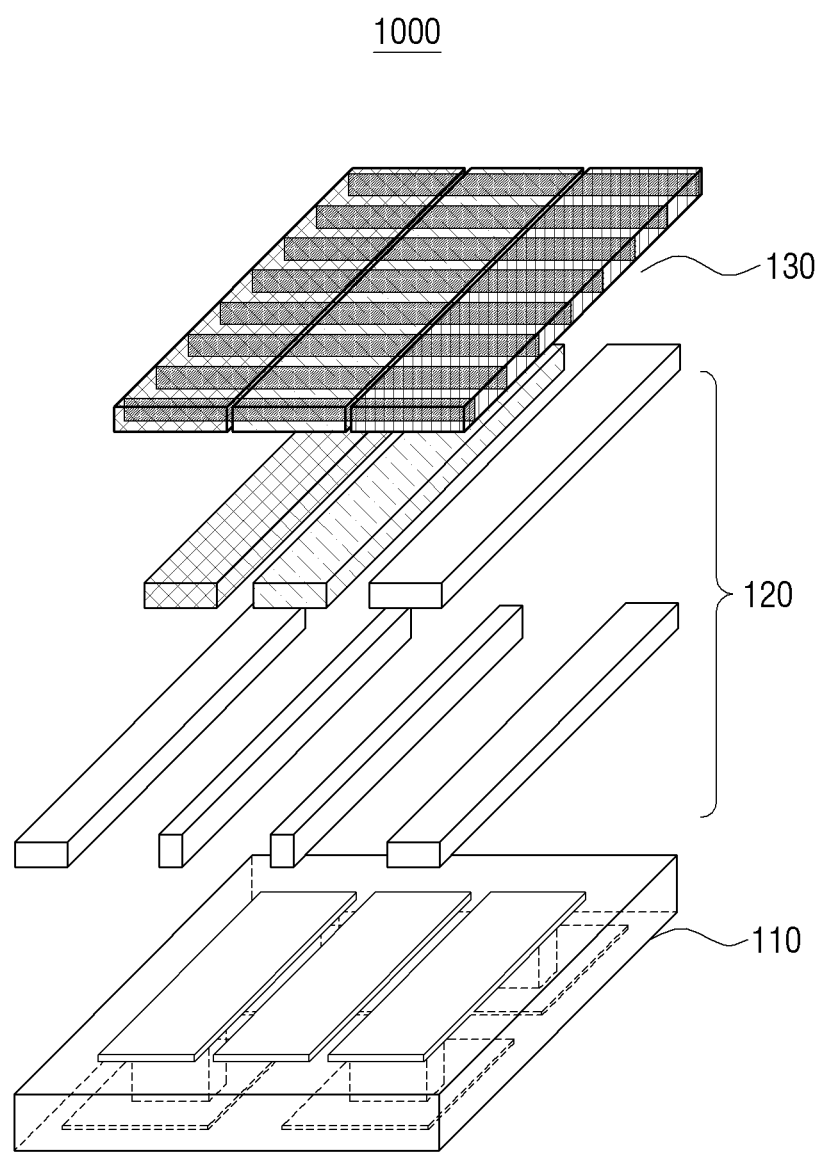
FIG. 1 is a view to illustrate a light emitting diode (LED) apparatus according to an exemplary embodiment.

FIG. 1 is a view to illustrate a light emitting diode (LED) apparatus 1000 according to an exemplary embodiment. Referring to FIG. 1, the LED apparatus 1000 includes an LED layer 110, a phosphor layer 120, and a filter layer 130.

The LED apparatus 1000 may operate as a display including a plurality of pixels. Herein, each of the pixels may include a plurality of sub-pixels and may have the same structure. Hereinafter, a case in which the LED apparatus 1000 comprises one pixel will be described for convenience of explanation. In this case, the plurality of LED apparatuses 1000 may be connected with one another to operate as a display.

The LED layer 110 may be a layer which is formed by growing a semiconductor material on a substrate. For example, the LED layer 110 may be a layer which is formed by growing a nitride having a hexagonal crystal system on a sapphire substrate. However, this should not be considered as limiting. Instead of the sapphire substrate, silicon may be used. In particular, the disclosure can be applied regardless of a manufacturing method as long as a plurality of LEDs included in the LED layer 110, which will be described below, emit light of the same wavelength.

The LED layer 110 may include the plurality of LEDs corresponding to a plurality of sub-pixels. For example, the LED layer 110 may include an LED corresponding to a red (R) sub-pixel, an LED corresponding to a green (G) sub-pixel, and an LED corresponding to a blue (B) sub-pixel.

Herein, the plurality of LEDs may have the same structure and emit light of the same wavelength. For example, all of the plurality of LEDs may emit light having a B component.

That is, the LED corresponding to the R sub-pixel, the LED corresponding to the G sub-pixel, and the LED corresponding to the B sub-pixel may have the same structure, but each of the LEDs emits light corresponding to each of the sub-pixels by additionally stacking a phosphor and a filter, which will be described below, on the LED.

The phosphor layer 120 may be stacked on the top of the LED layer 110 and may include a phosphor corresponding to at least a part of the plurality of sub-pixels. Herein, the phosphor, which is a kind of a light emitting substance, is a substance which absorbs energy and emits light of red, green, and blue, and may be an inorganic phosphor, an organic phosphor, and a quantum dot. For example, the inorganic phosphor may be a β SiAlON phosphor (β-SiAlON: Eu2+), a nitride-based phosphor such as a CASN-based (CaAlSiN3: Eu2+) or SCASN-based phosphor, KSF-based phosphor (K2SiF6: Mn+4), a sulfide-based phosphor, a yttrium aluminum garnet (YAG)-based phosphor activated with cerium, a nitrogen-containing amino calcium silicate (CaO-Al2O3-SiO2)-based phosphor activated with at least one of lutetium aluminum garnet (LAG) activated with cerium, europium, and chrome, a silicate ((Sr, Ba) 2 SiO4)-based phosphor activated with europium, or the like. In addition, the quantum dot may use II-VI, III-V, IV-VI semiconductors, and more particularly, high dispersion particles of a nano size, such as CdSe, core shell-shaped CdSxSe1-x/Zns, Gap, or the like.

The phosphor layer 120 may include a first phosphor which is stacked on the top of the LED that corresponds to the R sub-pixel from among the plurality of LEDs, and emits light including an R component, and a second phosphor which is stacked on the top of the LED that corresponds to the G sub-pixels from among the plurality of LEDs, and emits light including a G component. In general, since the LED emits light including the B component, a phosphor is not stacked on the top of the LED corresponding to the B sub-pixel, and a resin or the like may be stacked on the top of the LED corresponding to the B sub-pixel. In this case, in response to a light emitting spectrum of at least one of UV and blue entering from the LED, the first phosphor and the second phosphor may emit light including the R component and light including the G component, respectively.

However, this should not be considered as limiting. The phosphor layer 120 may further include a third phosphor which is stacked on the top of the LED corresponding to the B sub-pixel. In this case, the third phosphor may convert the wavelength of light including the B component, which enters from the LED, and may emit light of blue which is required in a manufacturing specification of a display.

In addition, the phosphor layer 120 may further include a partition. The partition may be formed between the plurality of phosphors to prevent inter-phosphor light from being mixed. In addition, the partition may be formed to enclose the exterior of the plurality of phosphors and thus prevent light from being mixed with light from other pixels.

Alternatively, the phosphor layer 120 may include only one kind of phosphor which is stacked to correspond to the R sub-pixel and the G sub-pixel from among the plurality of LEDs. In this case, the phosphor may emit light including the R component and the G component and may be a phosphor which entirely differs from the first phosphor, the second phosphor, and the third phosphor described above in its characteristic.

In manufacturing a high-pixel display, it may be easy to stack one phosphor corresponding to a plurality of sub-pixels rather than stacking phosphors corresponding to the respective sub-pixels. The light including the R component and the G component which is emitted from one phosphor may be filtered into light of a desired wavelength by a filter. However, when one phosphor is used, a color characteristic may be degraded than when phosphors corresponding to the respective sub-pixels are used, and an additional filter may be provided to enhance the color characteristic. This will be described in detail below.

The filter layer 130 may be stacked on the top of the phosphor layer 120 and may include a plurality of color filters corresponding to the plurality of sub-pixels. For example, the plurality of color filters may include a first color filter which is stacked on the top of the first phosphor, a second color filter which is stacked on the top of the second phosphor, and a third color filter which is formed on the top of the LED corresponding to the B sub-pixel from among the plurality of LEDs.

That is, the first color filter may allow only the light including the R component to pass therethrough, the second color filter may allow only the light including the G component to pass therethrough, and the third color filter may allow only the light including the B component to pass therethrough. The color filter may be a narrow band color filter and may increase color purity without causing an optical loss.

In response to a voltage not being applied to the plurality of LEDs, it is desirable that each of the sub-pixels appears black. However, there is a problem that the sub-pixels appear bright black due to light which is reflected after entering from the outside.

The filter layer may filter light entering from the outside and light reflected again, such that each of the sub-pixels appears black in response to a voltage not being applied to the plurality of LEDs. That is, when the filter layer is not provided, the color of the pixel may be brighter than when the filter layer is provided.

Each of the plurality of color filters may include a plurality of absorption films which are spaced from one another at a predetermined interval to absorb external light. The absorption film may include a light absorption material and the light absorption material may include a colored particle having light absorptiveness such as carbon black or the like. However, this should not be considered as limiting. The light absorption material may be a light absorption material which selectively absorbs a specific wavelength according to a characteristic of image light. For example, the light absorption material may be an organic particle colored with metallic salt, dye, pigment, or the like, such as carbon black, graphite, black iron oxide, or the like, or a colored glass bead. The structure and the role of the absorption film will be described below with reference to FIGS. 2A and 2B.

Figure 2A:
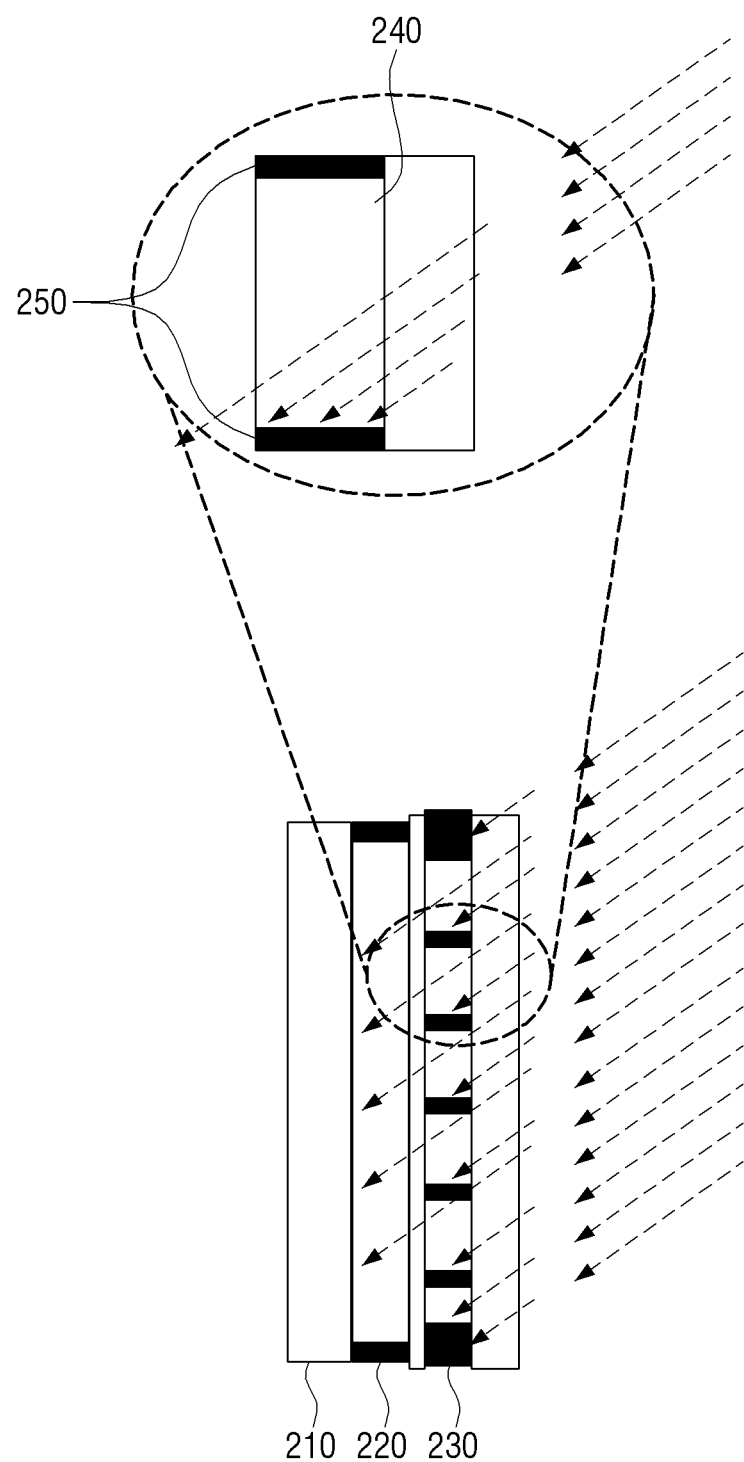
FIGS. 2A and 2B are views to illustrate a filter layer including an absorption film according to an exemplary embodiment.
Figure 2B:
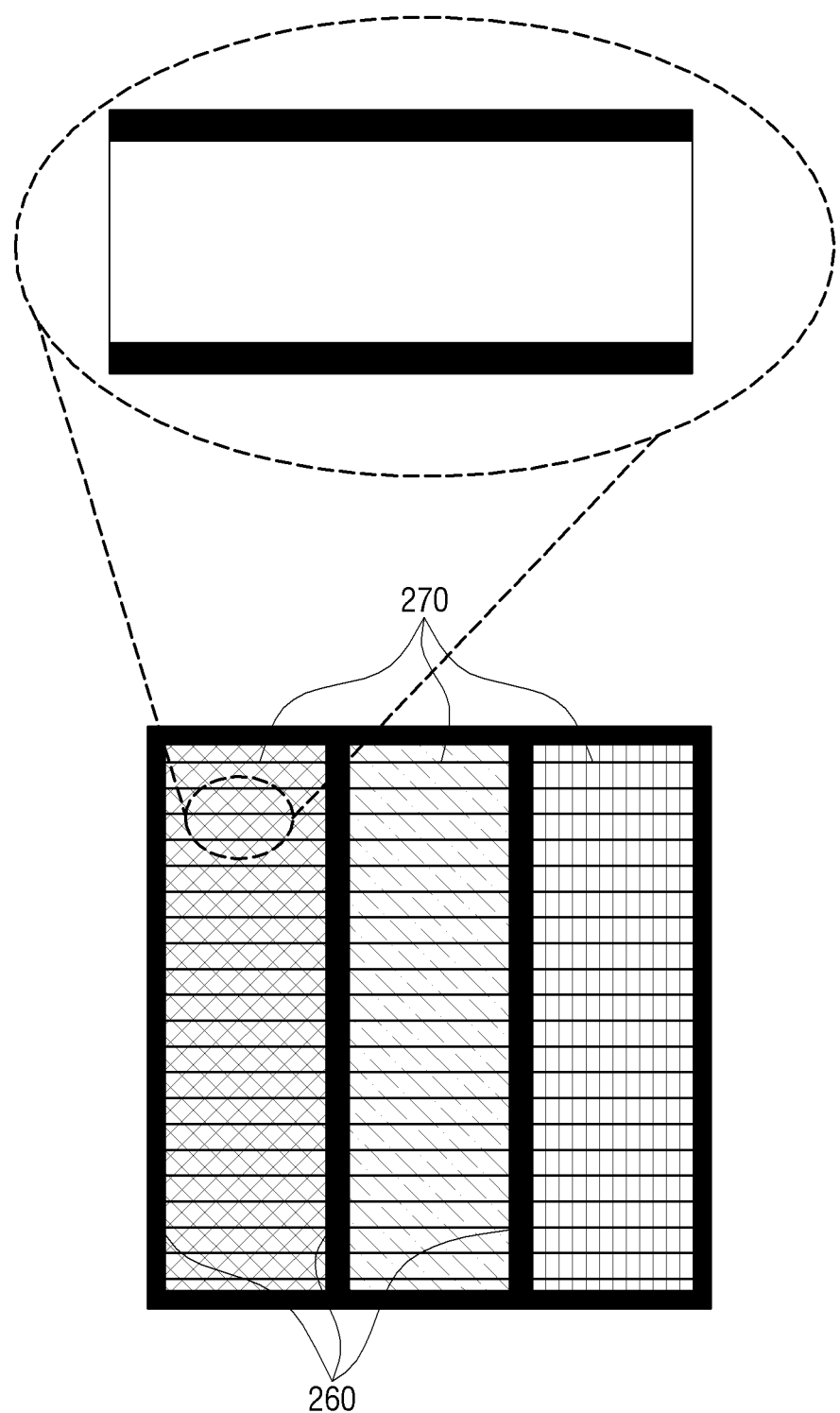

FIGS. 2A and 2B are views to illustrate the filter layer 130 including the absorption films according to an exemplary embodiment.

FIG. 2A shows a side view of one sub-pixel in the filter layer 130 and a view enlarging a part thereof. One sub-pixel includes an LED 210, a phosphor 220, and a color filter 230. Herein, the phosphor 220 and the color filter 230 may have the same structure regardless of the type of the sub-pixel. That is, the phosphor 220 and the color filter 230 may be formed to have different materials according to the corresponding sub-pixel, but may have the same structure and/or shape.

The color filter 230 may include a plurality of absorption films which are spaced from one another by a predetermined distance to absorb external light. The structure of the color filter 230 shown in FIG. 2A is referred to as a louver structure, and the louver structure is a shape which has long and thin plates arranged in a horizontal or vertical direction or in a grid pattern, and is installed on the front surface of an opening to block light.

Herein, the external light may refer to light which has an incidence angle greater than or equal to 0° with respect to the color filter 230. That is, light perpendicularly entering the color filter 230 may not be absorbed, but light which enters the color filter 230 at an angle that is not perpendicular to the color filter 230 may be partially absorbed by the plurality of absorption films.

Referring to the enlarged view of FIG. 2A, some region 240 of the color filter 230 may have an upper end and a lower end contacting the plurality of absorption films 250. In addition, external light entering from the upper side may be absorbed by the absorption film 250 contacting the lower end.

In general, light emitted from a light source provided on a ceiling may enter from the upper side of a display. Accordingly, the external light entering some region 240 of the color filter 230 may be absorbed by the absorption film 250 contacting the lower end from among the plurality of absorption films 250. Accordingly, degradation in image quality caused by external light can be enhanced and a color gamut can be expanded.

In FIG. 2A, the absorption film 250 extends in the horizontal direction of the drawing and the color filter 230 extends in the vertical direction of the drawing. Accordingly, the absorption film 250 is illustrated as being perpendicular to the color filter 230. However, this should not be considered as limiting, and the absorption film 250 may not be perpendicular to the color filter 230. For example, the absorption film 250 may be implemented to be perpendicular to the light entering at an angle that is not perpendicular to the color filter 230, as shown in FIG. 2A. In this case, the absorption film 250 may form an angle smaller than 90° with respect to the color filter 230.

FIG. 2B is a front view of the filter layer 130. The filter layer 130 may include a plurality of color filters, and the plurality of color filters may be divided by a black matrix 260 and enclosed thereby.

One color filter may be divided into N+1 regions by N absorption films 270. In addition, the length of the absorption film 270 may be identical to the length of one side of one color filter.

In FIG. 2B, the absorption film 270 extends in the horizontal direction of the drawing, but this should not be considered as limiting. For example, the absorption film 270 may extend in in the vertical direction of the drawing according to the direction of external light.

Figure 3A:
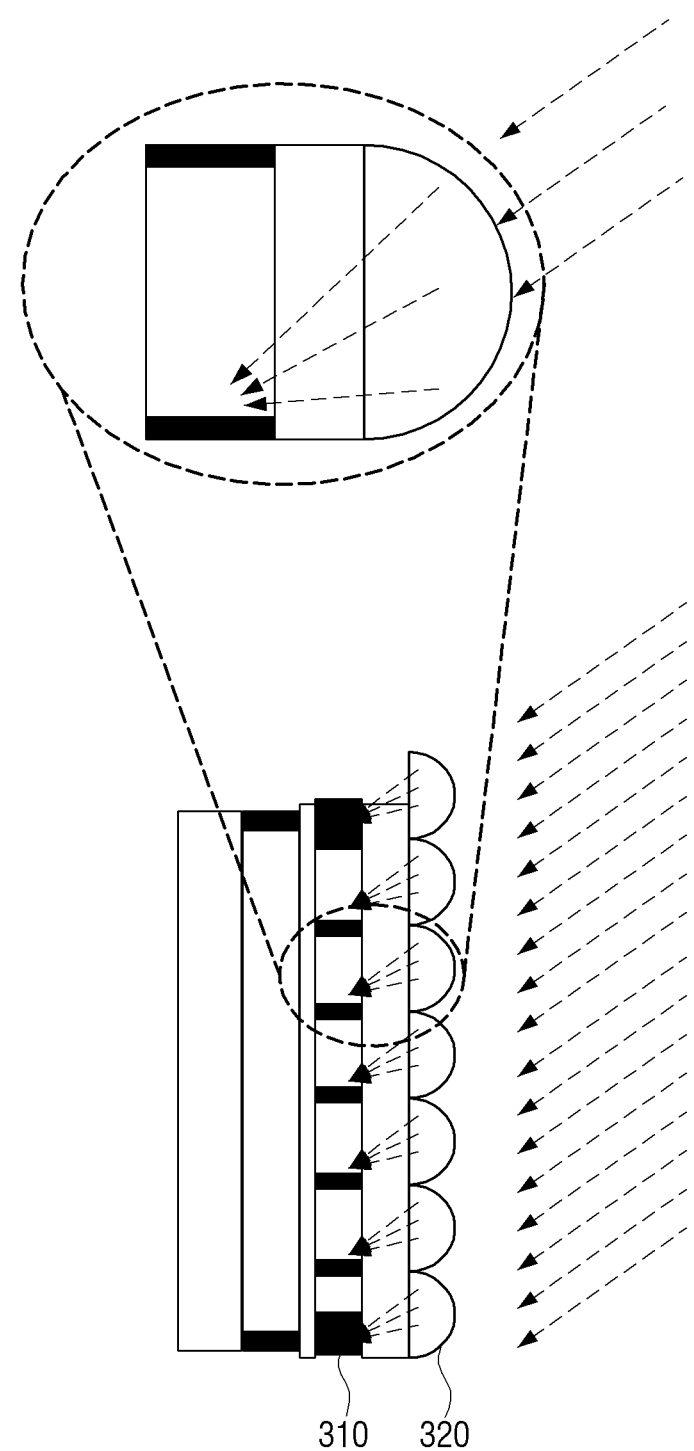
FIG. 3A is a view to illustrate a side surface of an LED apparatus which is additionally provided with a lenticular lens layer according to an exemplary embodiment.

FIG. 3A is a view to illustrate a side surface of the LED apparatus 1000 which is additionally provided with a lenticular lens layer according to an exemplary embodiment.

The lenticular lens layer may include a plurality of lenticular lens units stacked on the tops of the plurality of color filters. Each of the plurality of lenticular lens units may include a plurality of lenticular lenses. For example, as shown in FIG. 3A, the plurality of lenticular lenses 320 may be stacked on the top of the color filter 310.

The plurality of lenticular lenses 320 may be arranged to correspond to the plurality of filter regions which are divided by the plurality of absorption films and to refract the external light to face the plurality of absorption films. That is, the plurality of lenticular lenses 320 may refract the external light in the vertical direction of the drawing.

An external light absorption rate when the plurality of lenticular lenses 320 are used may be higher than an external light absorption rate when the plurality of lenticular lenses 320 are not used as shown in FIGS. 2A and 2B. Accordingly, degradation in image quality caused by external light can be enhanced and thus a color gamut can be expanded.

Figure 3B:
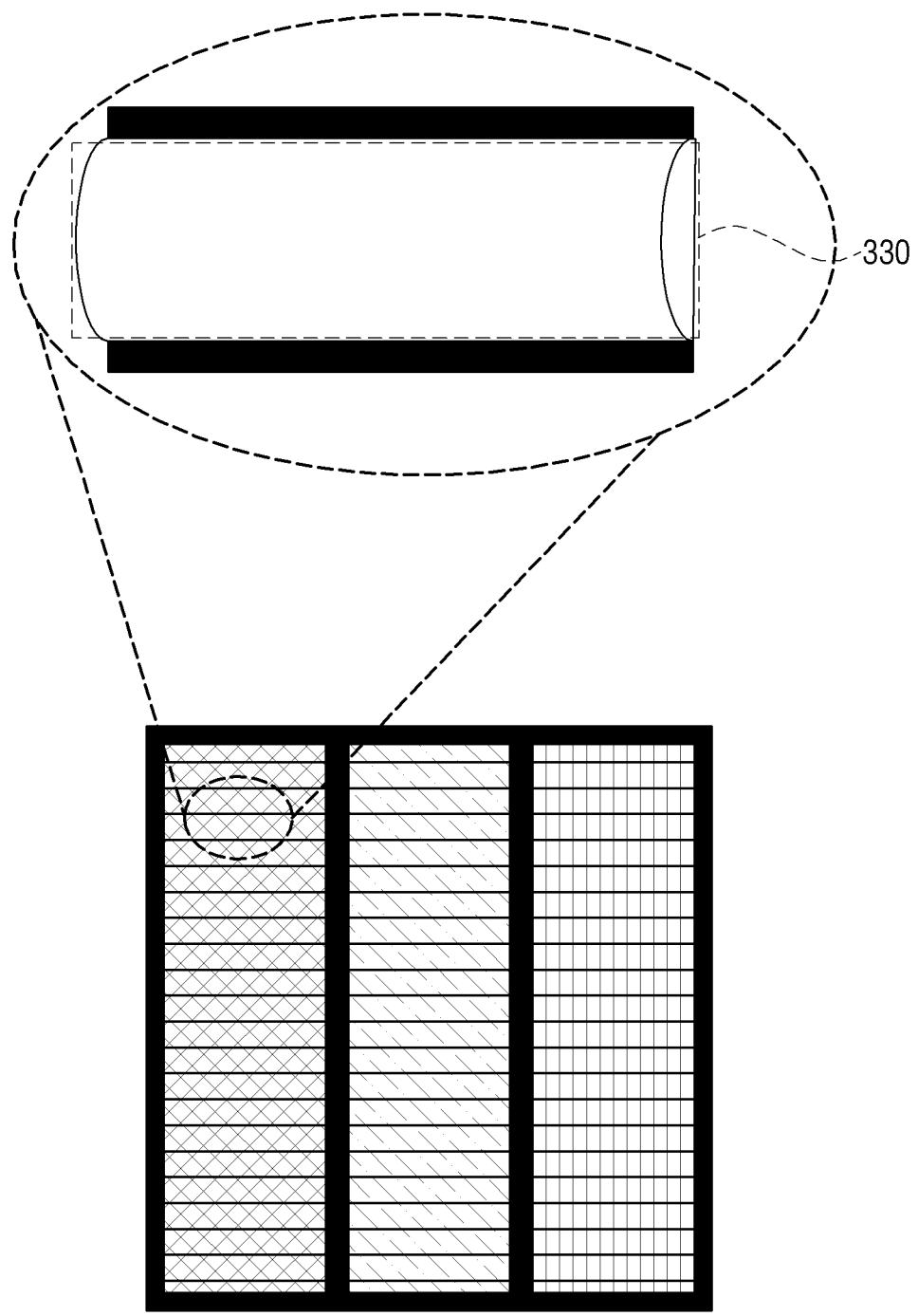
FIG. 3B is a view to illustrate a front surface of a filter layer on which a lenticular lens layer is stacked according to an exemplary embodiment.

FIG. 3B is a view to illustrate a front surface of the filter layer 130 on which the lenticular lens layer is stacked according to an exemplary embodiment.

One color filter may be divided into N+1 regions by N absorption films, and the lenticular lens may be stacked on the top of each of the N+1 regions.

Referring to the enlarged view of FIG. 3B, one lenticular lens 330 may be stacked on the top of one color filter region divided by the absorption films, and the lenticular lens 330 may have the shape of a cylinder cut in half lengthways. In addition, the length of the lenticular lens 330 may be equal to the length of one side of one color filter.

In addition, the lenticular lens 330 refracts external light entering in the vertical direction of the drawing, and does not refract the external light entering in the horizontal direction of the drawing.

In FIG. 3B, the lenticular lens 330 has the shape of a cylinder cut in half. However, this should not be considered as limiting. For example, the lenticular lens 330 may have any shape as long as the lenticular lens 330 can refract external light toward the absorption film.

Figure 4A:
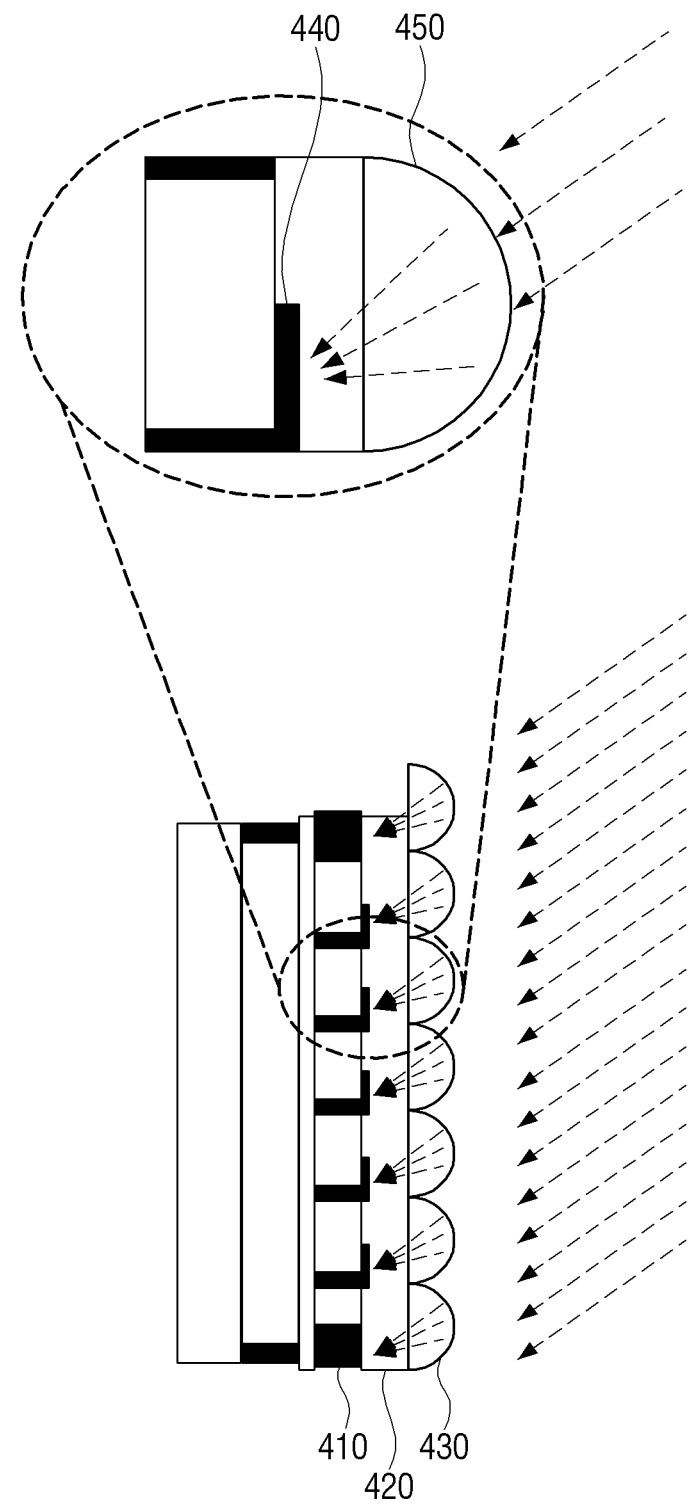
FIG. 4A is a view to illustrate a side surface of an LED apparatus which is additionally provided with a blocking layer and a micro lens layer according to another exemplary embodiment.

FIG. 4A is a view to illustrate a side surface of the LED apparatus 1000 which is additionally provided with a blocking layer and a micro lens layer according to another exemplary embodiment.

The blocking layer may include a plurality of blocking films which are connected with the plurality of absorption films in the vertical direction and are formed on the top of the filter layer 130. For example, as shown in FIG. 4A, the LED apparatus 1000 may include the blocking layer 420 including the plurality of absorption films formed on the top of the color filter 410.

In addition, the micro lens layer may include a plurality of micro lens units formed on the top of the blocking layer 420 to correspond to the plurality of color filters, and each of the plurality of micro lens units may include a plurality of micro lenses. For example, as shown in FIG. 4A, the plurality of micro lenses 430 may be stacked on the top of the blocking layer 420.

The plurality of micro lenses 430 may be arranged to correspond to the plurality of blocking films and to refract external light to face the plurality of blocking films. That is, the plurality of micro lenses 430 may refract the external light in the vertical direction of the drawing.

Referring to the enlarged view of FIG. 4A, the blocking film 440 may block a part of the external light refracted by the micro lens 450 and may allow the other part to pass therethrough. The external light passing through the blocking film 440 reaches the absorption film.

That is, an external light blocking and absorption rate when the plurality of micro lenses 430 are used may be higher than an external light blocking and absorption rate when the plurality of micro lenses 430 are not used as shown in FIGS. 2A and 2B. Accordingly, degradation in image quality caused by external light can be enhanced and thus a color gamut can be expanded.

Figure 4B:
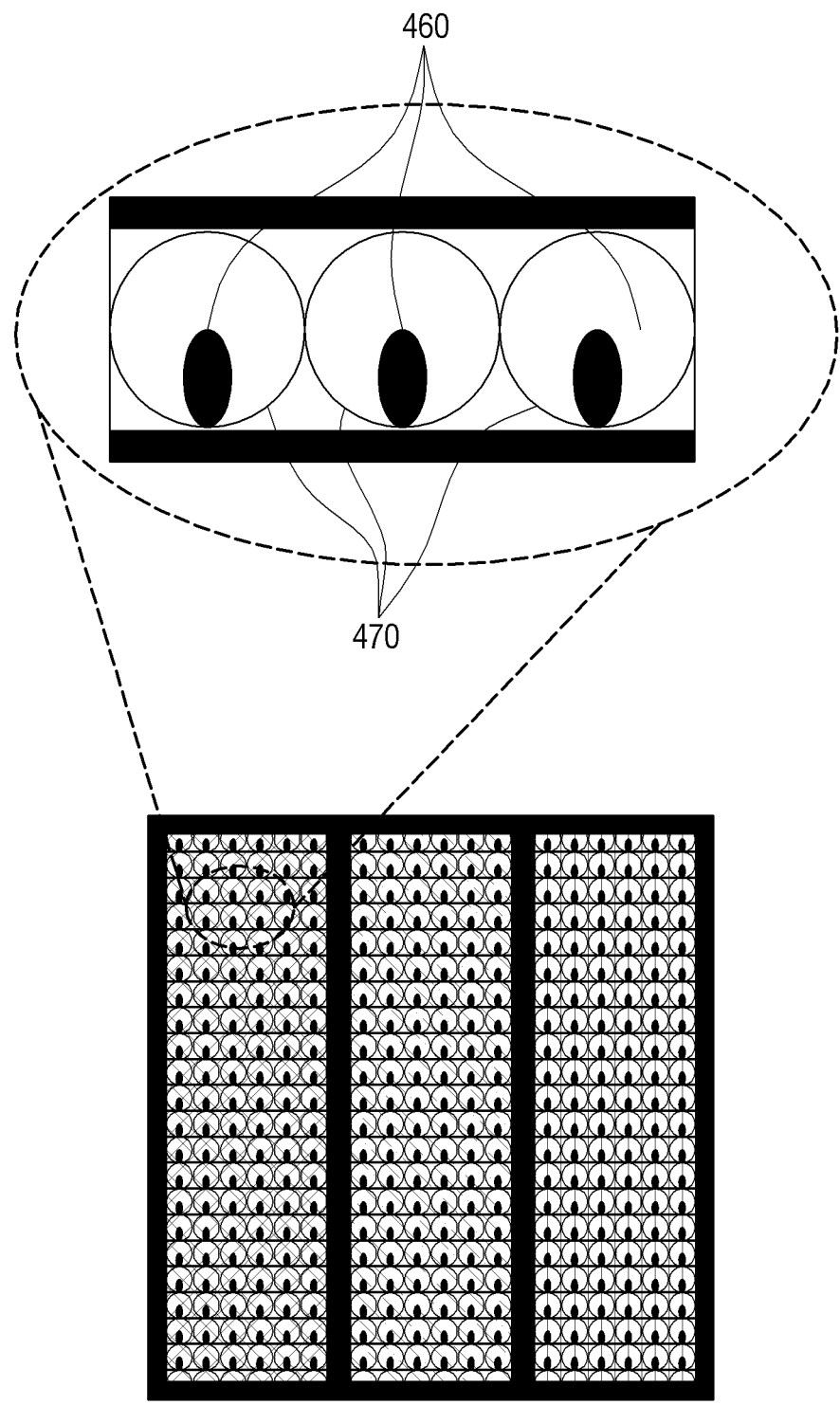
FIG. 4B is a view to illustrate a front surface of a filter layer on which a blocking layer and a micro lens layer are stacked according to an exemplary embodiment.

FIG. 4B is a view to illustrate a front surface of the filter layer 130 on which the blocking layer and the micro lens layer are stacked according to an exemplary embodiment.

One color filter may be divided into N+1 regions by N absorption films, and the plurality of blocking films and the plurality of micro lenses may be formed on the tops of the N+1 regions. That is, each of the plurality of blocking films may be formed on a part of each of the plurality of filter regions which are divided by the plurality of absorption films at predetermined intervals to block external light. In addition, the plurality of micro lenses may be formed to correspond to the plurality of absorption films.

In FIG. 4B, six blocking films and six micro lenses are formed on the top of one of the N+1 regions. However, this is merely an example and a different number of blocking films and micro lenses may be formed.

Referring to the enlarged view of FIG. 4B, the plurality of blocking films 460 and the plurality of micro lenses 470 may be formed on the top of one color filter region divided by the absorption films, and each of the micro lenses 470 may have a shape of a sphere cut in half.

In addition, the micro lens 470 may refract entering external light in the vertical direction and horizontal direction of the drawing to allow the external light to reach a corresponding blocking film.

In FIG. 4B, the micro lens 470 is formed in a shape of a sphere cut in half, but this should not be considered as limiting. For example, the micro lens 470 may have any shape as long as the micro lens 470 can refract external light toward the blocking film 460.

Figure 5:
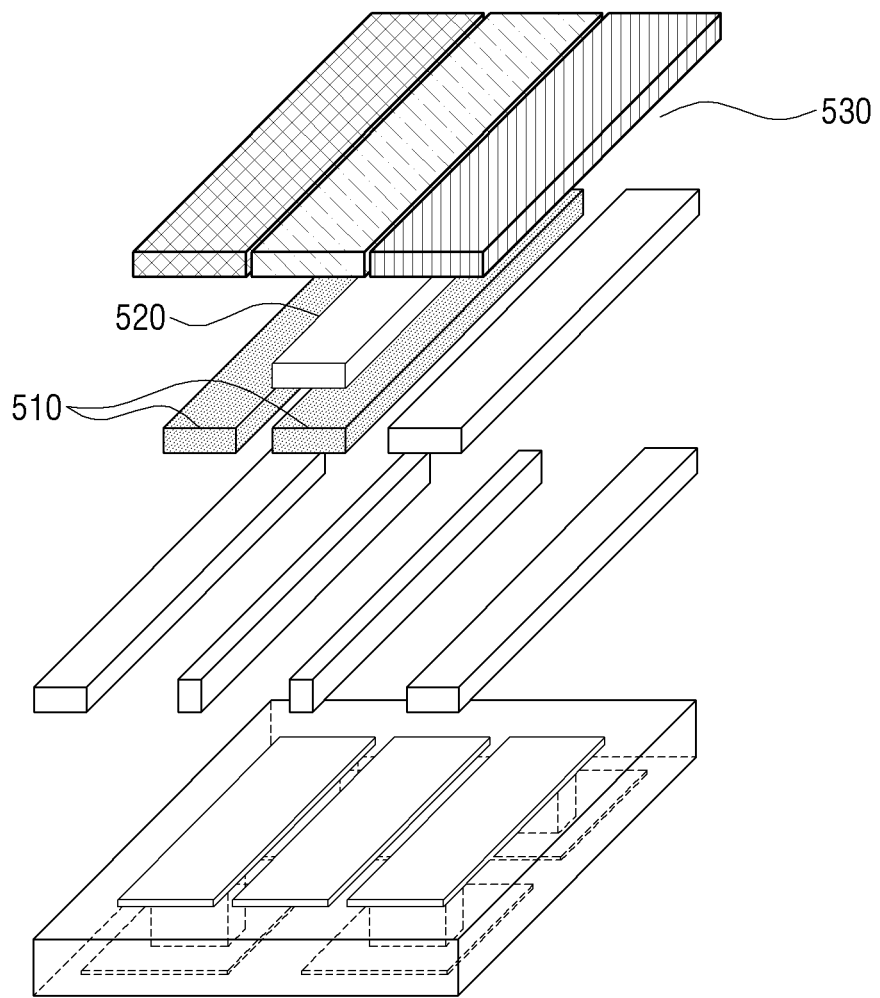
FIG. 5 is a view to illustrate a case in which a blue cut filter is provided according to an exemplary embodiment.

FIG. 5 is a view to illustrate a case in which a blue cut filter is provided according to an exemplary embodiment. The same elements of FIG. 5 as those of FIG. 1 will not be described.

A phosphor layer 510 may include only one kind of phosphor which is stacked to correspond to the R sub-pixel and the G sub-pixel from among the plurality of LEDs. That is, the phosphor stacked to correspond to the R sub-pixel and the phosphor stacked to correspond to the G sub-pixel may be formed to have the same configuration. In addition, the two phosphors may emit light including the R component and the G component. Light emitted from the two phosphors may pass through a corresponding filter and may be emitted as light including the R component and light including the G component. In this case, a color characteristic may be degraded than in the case in which phosphors are used for the respective sub-pixels.

In addition, in filtering the B component, the efficiency of the second color filter corresponding to the G sub-pixel may be lower than the efficiency of the first color filter corresponding to the R sub-pixel.

Accordingly, as shown in FIG. 5, the blue cut filter 520 may be disposed on a G sub-pixel region between the phosphor layer 510 and the filter layer 530. The blue cut filter 520 may filter the B component out of the light emitted from the phosphor. That is, the blue cut filter 520 is additionally stacked such that the color characteristic of the G sub-pixel can be enhanced.

Figure 6:
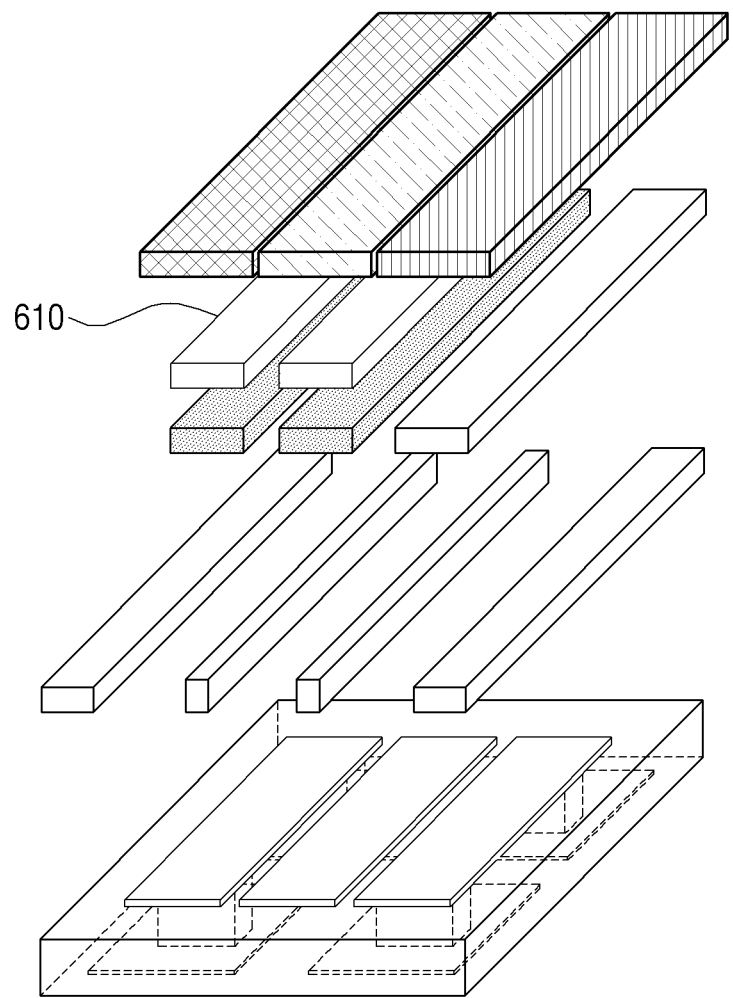
FIG. 6 is a view to illustrate a case in which an absorbing dye layer is provided according to another exemplary embodiment.

FIG. 6 is a view to illustrate a case in which an absorbing dye layer is provided according to another exemplary embodiment. The configuration of FIG. 6 further includes the absorbing dye layer in addition to the configuration of FIG. 5, and the same elements of FIG. 6 as those of FIG. 5 will not be described.

As shown in FIG. 6, the absorbing dye layer 610 may be disposed on an R sub-pixel region between the phosphor layer 510 and the filter layer 530. The absorbing dye layer 610 may absorb a wavelength component between the R component and the G component in the light emitted from the phosphors. Accordingly, the color characteristic of the R sub-pixel can be enhanced.

In FIG. 6, both the blue cut filter and the absorbing dye layer are used. However, this should not be considered as limiting. For example, only the absorbing dye layer may be used without the blue cut filter.

In addition, in FIGS. 5 and 6, the filter layer which does not include the absorbing films is illustrated. However, this is merely for convenience of explanation. At least one of the blue cut filter and the absorbing dye layer may be used when the filter layer described above with reference to FIGS. 1 to 4B is applied.

FIGS. 7A to 7D are views to illustrate a color gamut according to whether the color filter and the blue cut filter are used according to an exemplary embodiment.

Figure 7A:
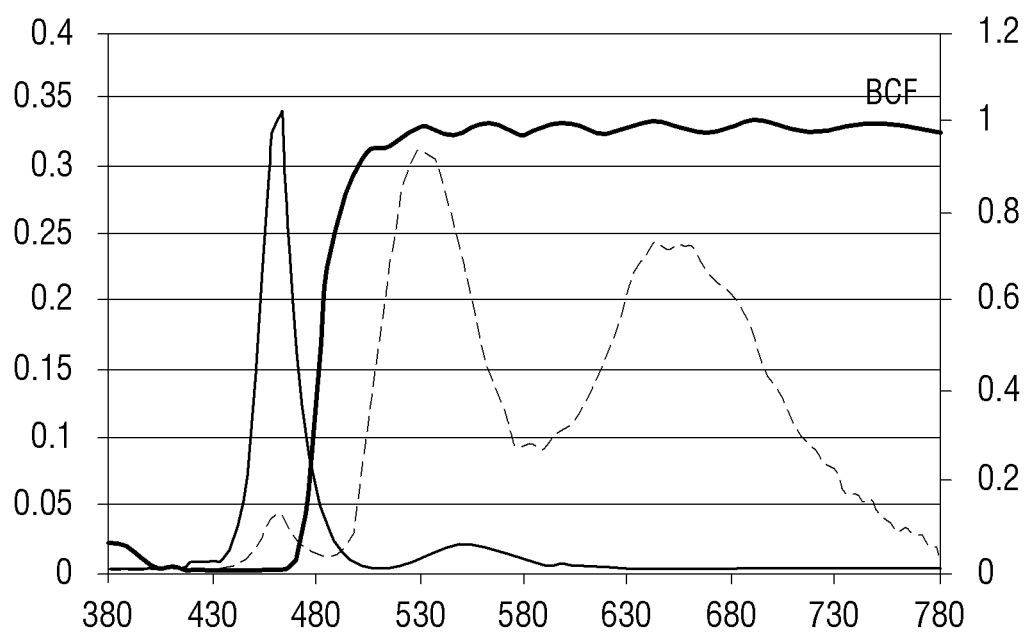

As shown in FIG. 7A, the blue cut filter may filter a wavelength of about 480 nm or lower. That is, the blue cut filter may not filter the R component and the G component which have a wavelength of about 480 nm or higher, and may filter the B component which has a wavelength of about 480 nm or lower.

Figure 7B:
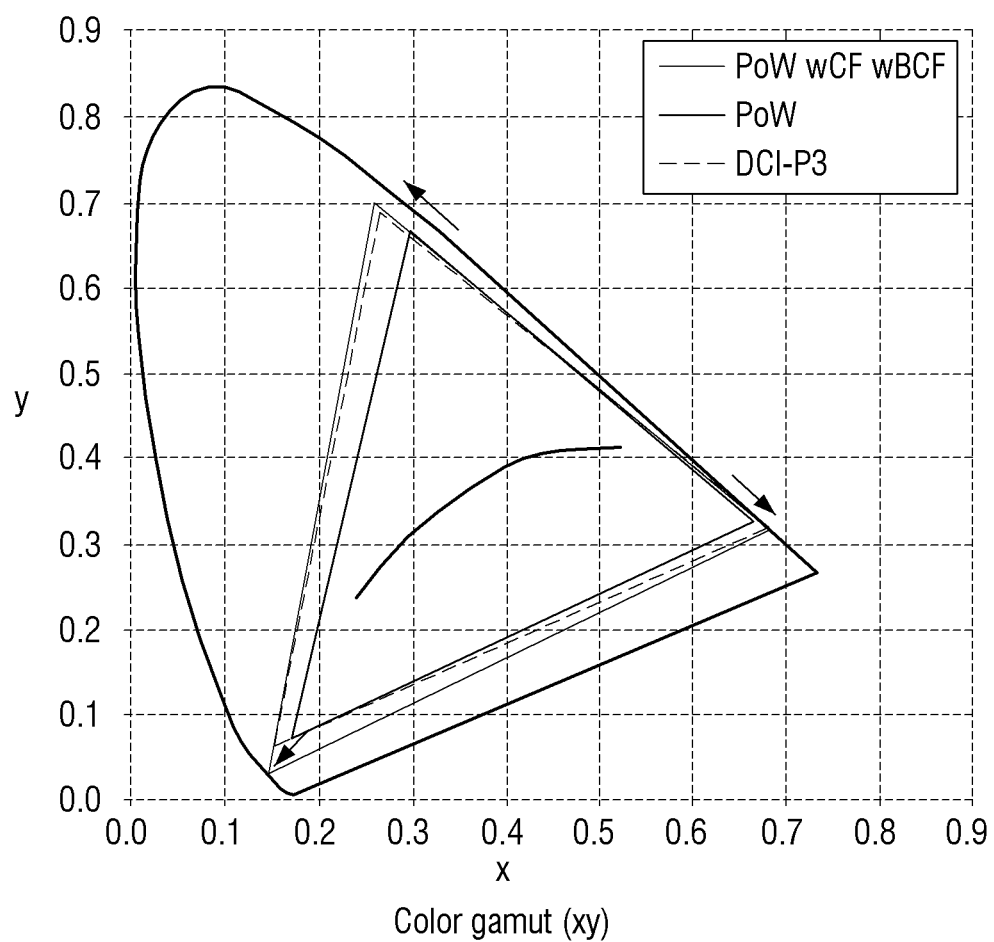
Figure 7C:
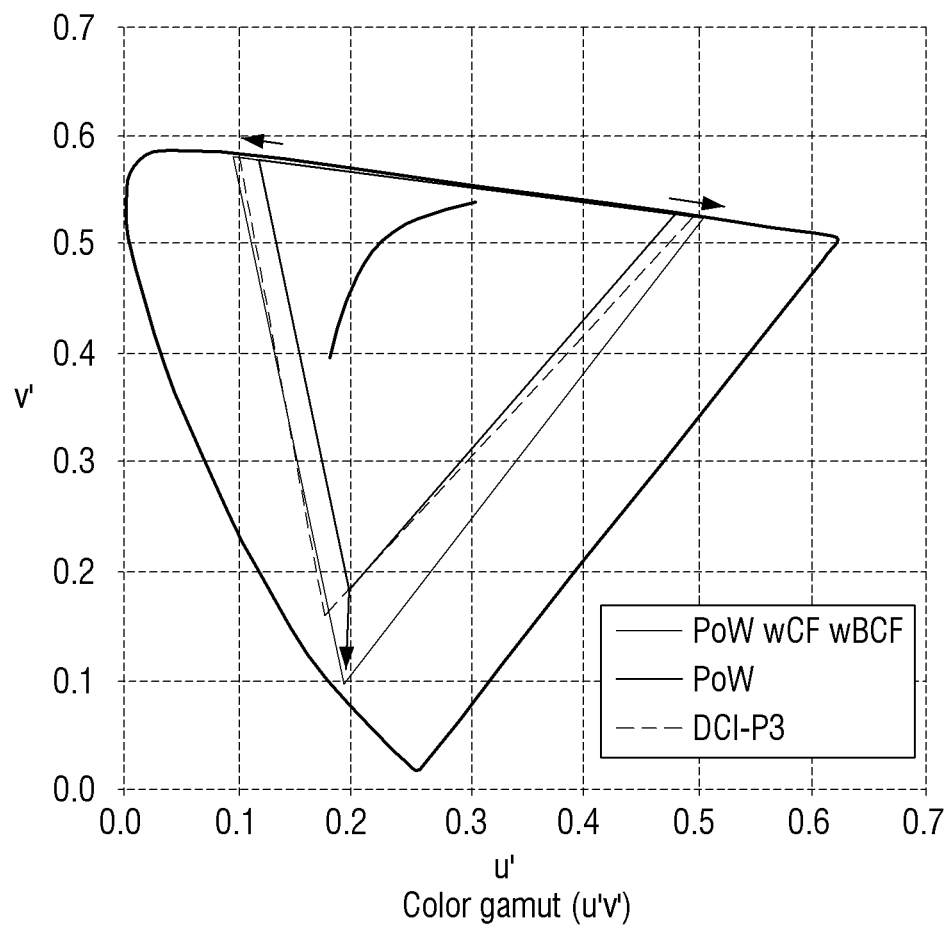

FIGS. 7B and 7C are views to compare color gamuts in an XY color space and an LUV color space according to whether the color filter and the blue cut filter are used. As shown in FIGS. 7B and 7C, the color gamut when the color filter and the blue cut filter are used may be wider than the color gamut when the color filter and the blue cut filter are not used. In addition, as shown in FIG. 7D, the color gamut formed when the color filter and the blue cut filter are used reaches 100% or higher in comparison to a DCI color gamut.

FIGS. 8A to 8D are views to illustrate color gamuts according to whether the color filter, the blue cut filter, and the absorbing dye layer are used according to an exemplary embodiment.

Figure 8A:
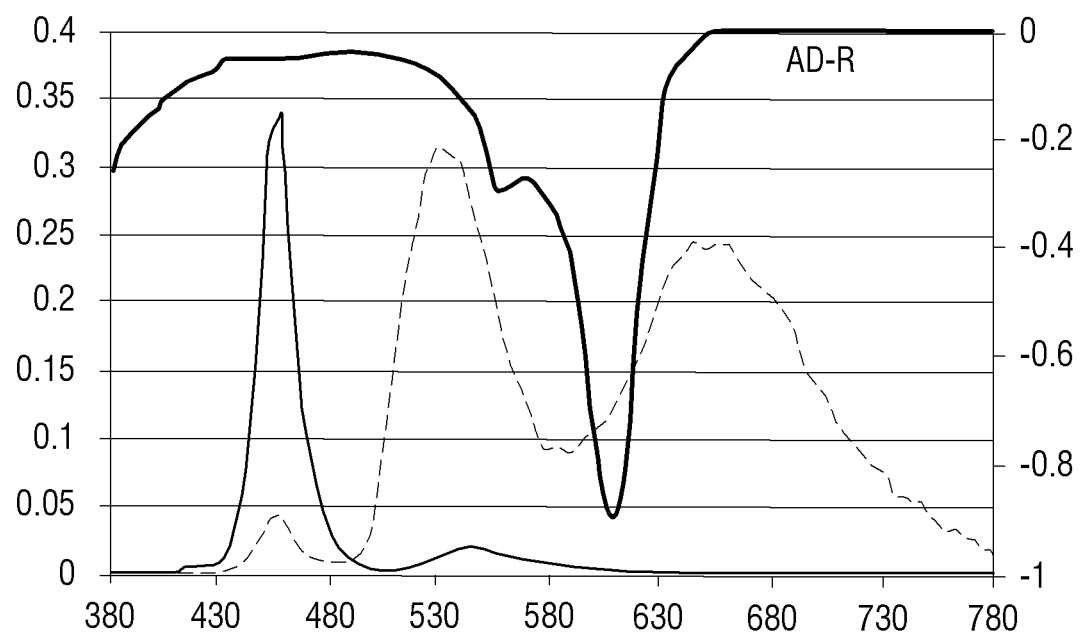

As shown in FIG. 8A, the absorbing dye layer may absorb light of a wavelength of about 600 nm, and may allow the other wavelengths to pass therethrough. That is, the absorbing dye layer may absorb a wavelength component between the R component and the G component.

Figure 8B:
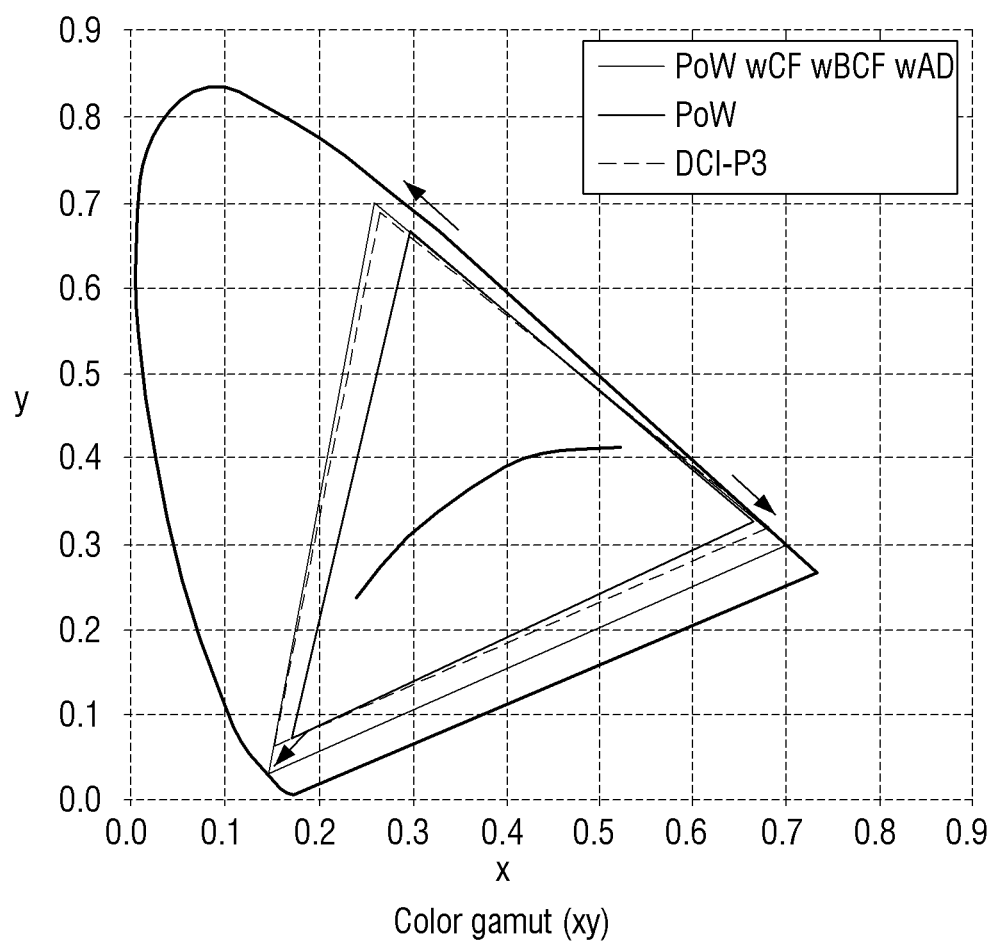
Figure 8C:
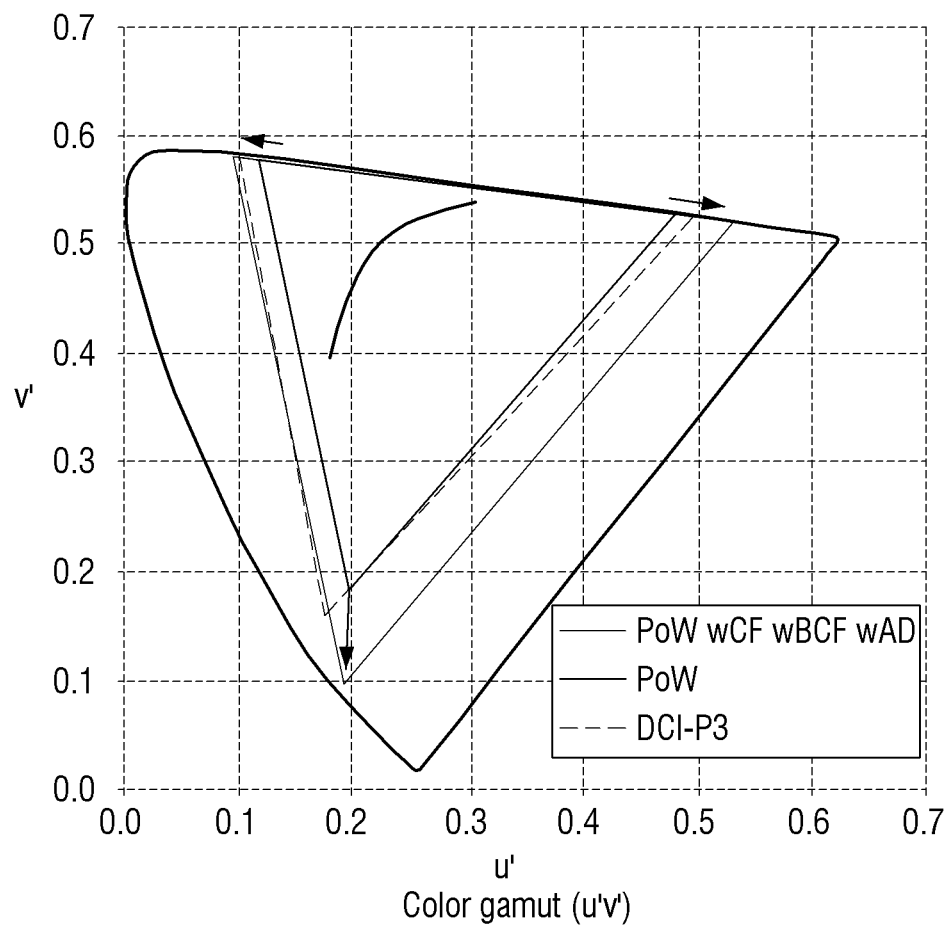

FIGS. 8B and 8C are views to compare color gamuts in an XY color space and a LUV color space according to whether the color filter, the blue cut filter, and the absorbing dye layer are used. As shown in FIGS. 8A and 8C, the color gamut when the color filter, the blue cut filter, and the absorbing dye layer are used may be wider than the color gamut when the color filter, the blue cut filter, and the absorbing dye layer are not used. In addition, the color gamut formed when the color filter, the blue cut filter, and the absorbing color layer are used may reach 100% or higher in comparison to a DCI color gamut.

FIGS. 9A to 9H are views to illustrate a process of manufacturing the LED apparatus 1000 according to an exemplary embodiment.

Figure 9A:
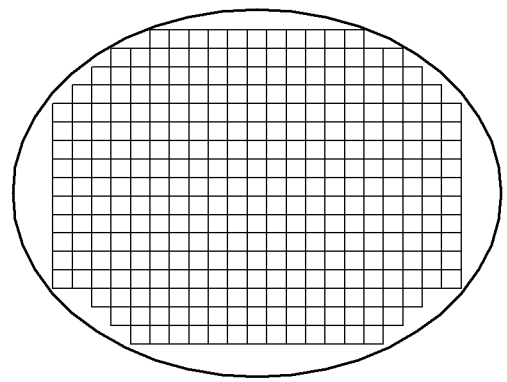
FIGS. 9A to 9H are views to illustrate a process of manufacturing an LED apparatus according to an exemplary embodiment.

First, a plurality of LEDs may be formed on a wafer as shown in FIG. 9A.

Figure 9B:
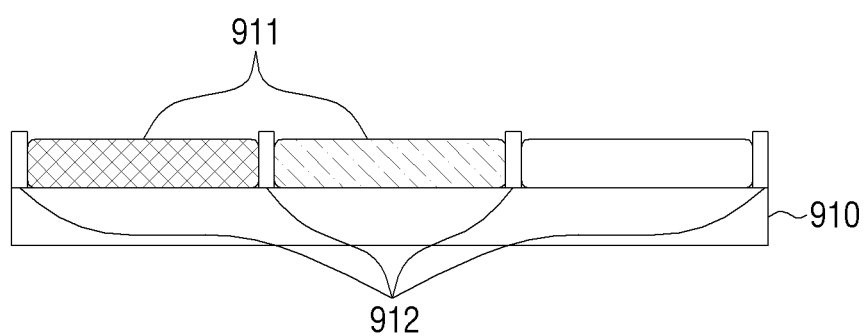

Then, a first phosphor and a second phosphor 911 corresponding to a R sub-pixel and a G sub-pixel, respectively, and a resin corresponding to a B sub-pixel may be formed on the LED 910 as shown in FIG. 9B. In addition, partitions 912 may be formed to separate the phosphors.

Figure 9C:
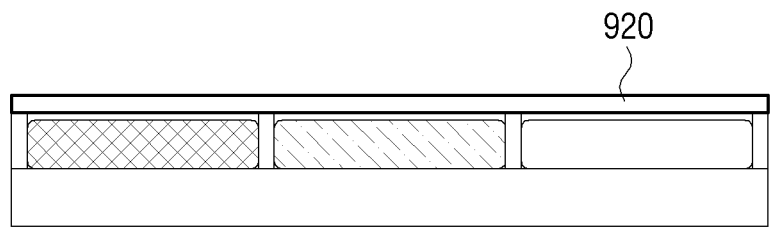

Thereafter, a layer 920 for smoothing may be formed by coating, exposing, and developing the plurality of phosphors, the resin, and the tops of the partitions as shown in FIG. 9C.

Figure 9D:
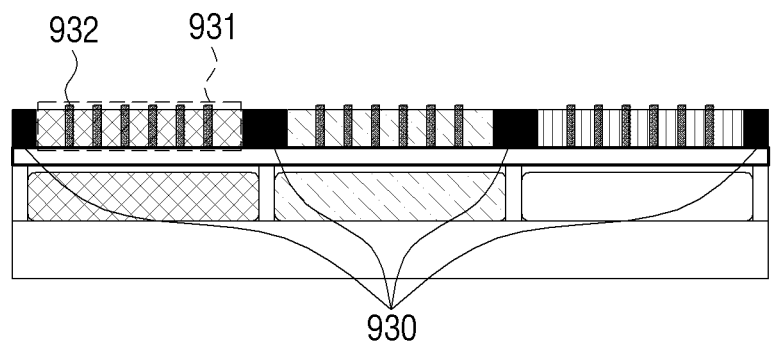

In addition, as shown in FIG. 9D, color filters corresponding to the respective sub-pixels may be formed. Each of the color filters may be divided by black matrixes 930. In this case, the color filter 931 may be formed to have a plurality of absorption films 932 formed therein.

Figure 9E:
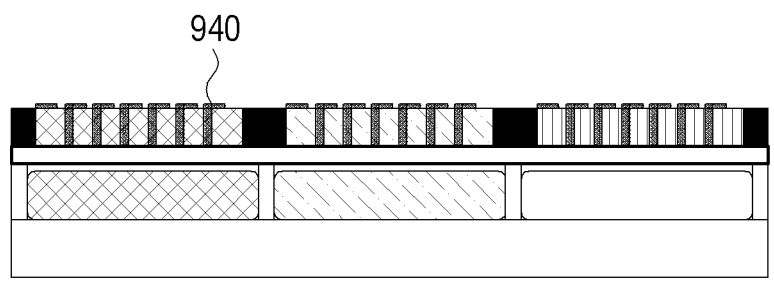

Thereafter, a blocking film 940 connected with the absorption film 932 may be formed as shown in FIG. 9E.

Figure 9F:
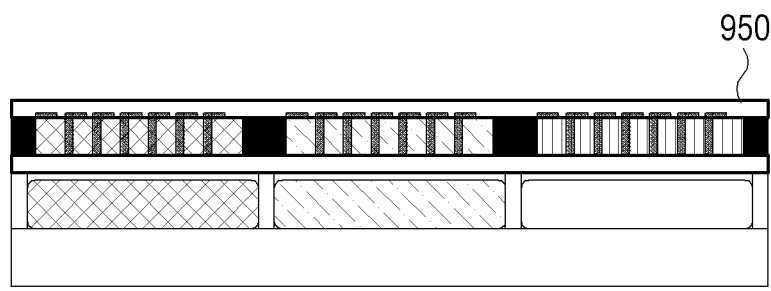

In addition, a protection film 950 may be coated to protect the absorption films 932 as shown in FIG. 9F.

Figure 9G:
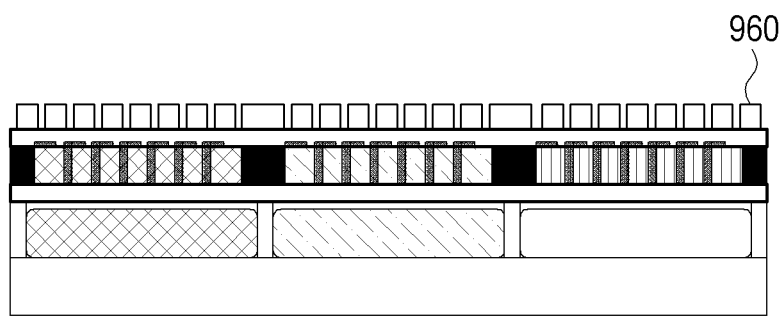

Thereafter, a micro lens material 960 may be formed by coating, exposing, and developing the protection film 950 as shown in FIG. 9G.

Figure 9H:
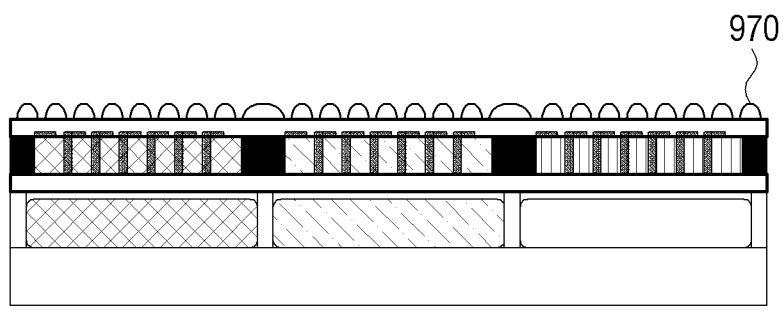

In addition, as shown in FIG. 9H, a hemispheric micro lens 970 may be formed by heating the micro lens material 960.

In the above description, the method of forming the micro lens layer has been described. However, at least one of a lenticular lens layer, a blue cut filter, and an absorbing dye layer may be formed by changing the above-described process.

For example, the color filters corresponding to the sub-pixels are formed as shown in FIG. 9D, and then a protection film may be coated to protect the color filters. In addition, a lenticular lens material may be formed by coating, exposing, and developing the top of the protection film, and a lenticular lens may be formed by heating the lenticular lens material.

Alternatively, the plurality of phosphors, the resin, and the partitions are formed as shown in FIG. 9B, and then a blue cut filter may be formed on the top of a phosphor corresponding to the G sub-pixel. A subsequent process has been described above and thus will not be described.

Alternatively, after the blue cut filter is formed, an absorbing dye layer may be formed on the top of a phosphor corresponding to the R sub-pixel. Then, a subsequent manufacturing process will be proceeded.

FIG. 10 is a flowchart to illustrate a method for manufacturing an LED apparatus according to an exemplary embodiment.

First, an LED layer including a plurality of LEDs corresponding to a plurality of sub-pixels is formed (S1010). In addition, on a top of the LED layer, a phosphor layer including a phosphor corresponding to at least a part of the plurality of sub-pixels is stacked (S1020). In addition, on a top of the phosphor layer, a filter layer including a plurality of color filters corresponding to the plurality of sub-pixels is stacked (S1030). Herein, each of the plurality of color filters may include a plurality of absorption films which are spaced from one another at predetermined intervals to absorb external light.

In addition, the method may further include stacking, on tops of the plurality of color filters, a plurality of lenticular lens units. Each of the plurality of lenticular lens units may include a plurality of lenticular lenses, and the plurality of lenticular lenses may be arranged to correspond to a plurality of filter regions divided by the plurality of absorption films and to refract the external light to face the plurality of absorption films.

The method may further include forming a blocking layer which includes a plurality of blocking films connected with the plurality of absorption films in a vertical direction and formed on the top of the filter layer, and each of the plurality of blocking films may be formed on a part of each of the plurality of filter regions, which are divided by the plurality of absorption films, at a predetermined interval to block the external light.

The method may further include stacking, on a top of the blocking layer, a plurality of micro lens units formed to correspond to the plurality of color filters. Each of the plurality of micro lens units may include a plurality of micro lenses, and the plurality of micro lenses may be arranged to correspond to the plurality of blocking films and to refract the external light to face the plurality of blocking films.

The stacking the phosphor layer (S1020) may include: stacking, on a top of an LED corresponding to an R sub-pixel from among the plurality of LEDs, a first phosphor emitting light including an R component; and stacking, on a top of an LED corresponding to a G sub-pixel from among the plurality of LEDs, a second phosphor emitting light including a G component.

The stacking the filter layer (S1030) may include: stacking a first color filter on a top of the first phosphor; stacking a second color filter on a top of the second phosphor; and forming a third color filter on a top of an LED corresponding to a B sub-pixel from among the plurality of LEDs.

The phosphor may be configured to correspond to an R sub-pixel and a G sub-pixel from among the plurality of LEDs, and emit light including an R component and a G component. The method may further include stacking a blue cut filter which is disposed on the G sub-pixel region between the phosphor layer and the filter layer, and the blue cut filter may be configured to filter a B component out of light emitted from the phosphor.

The method may further include stacking an absorbing dye layer which is disposed on the R sub-pixel region between the phosphor layer and the filter layer, and the absorbing dye layer may be configured to absorb a wavelength component between the R component and the G component in light emitted from the phosphor.

In addition, the phosphor may be configured to convert light entering from the plurality of LEDs into a wavelength of a corresponding sub-pixel, and disperse the light of the converted wavelength outwardly through an inner dispersing member.

According to various exemplary embodiments as described above, the contrast of the LED apparatus can be enhanced by blocking and/or absorbing external light entering the LED apparatus.

The methods according to various exemplary embodiments as described above may be programmed and stored in various storage media. Accordingly, the method according to the above-described various exemplary embodiments may be implemented in various kinds of electronic devices executing storage media.

Specifically, a non-transitory computer readable medium which stores a program for performing the above-described control method in sequence may be provided.

The non-transitory computer readable medium refers to a medium that stores data semi-permanently rather than storing data for a very short time, such as a register, a cache, a memory or etc., and is readable by an apparatus. Specifically, the above-described various applications or programs may be stored in the non-transitory computer readable medium such as a compact disc (CD), a digital versatile disk (DVD), a hard disk, a Blu-ray disk, a universal serial bus (USB), a memory card, a ROM or etc., and may be provided While the disclosure has been shown and described with reference to certain exemplary embodiments thereof, it will be understood by those skilled in the art that various changes in form and details may be made therein without departing from the spirit and scope of the disclosure as defined by the appended claims. Therefore, the scope of the disclosure is defined not by the detailed description of the disclosure but by the appended claims, and all differences within the scope will be construed as being included in the disclosure.

What is claimed is:

1. A light emitting diode (LED) apparatus comprising:
    an LED layer comprising a plurality of LEDs corresponding to a plurality of sub-pixels;
    a phosphor layer which is stacked on top of the LED layer and comprises a phosphor corresponding to at least a part of the plurality of sub-pixels; and
    a filter layer which is stacked on top of the phosphor layer and comprises a plurality of color filters corresponding to the plurality of sub-pixels,
    wherein each of the plurality of color filters comprises a plurality of absorption films which are spaced from one another at predetermined intervals to absorb external light and disposed between each of the plurality of color filters corresponding to each of the plurality of sub-pixels, and
    wherein the plurality of color filters are divided by a black matrix.

2. The LED apparatus of claim 1, further comprising a lenticular lens layer comprising a plurality of lenticular lens units which are stacked on tops of the plurality of color filters,
    wherein each of the plurality of lenticular lens units comprises a plurality of lenticular lenses,
    wherein the plurality of lenticular lenses are arranged to correspond to a plurality of filter regions divided by the plurality of absorption films and to refract the external light toward the plurality of absorption films.

3. The LED apparatus of claim 1, further comprising a blocking layer which comprises a plurality of blocking films connected with the plurality of absorption films in a vertical direction and formed on a top of the filter layer, and
    wherein each of the plurality of blocking films is formed on a part of each of a plurality of filter regions, which are divided by the plurality of absorption films, at a predetermined interval to block the external light.

4. The LED apparatus of claim 3, further comprising a micro lens layer which comprises a plurality of micro lens units formed on a top of the blocking layer to correspond to the plurality of color filters,
    wherein each of the plurality of micro lens units comprises a plurality of micro lenses, and
    wherein the plurality of micro lenses are arranged to correspond to the plurality of blocking films and to refract the external light toward the plurality of blocking films.

5. The LED apparatus of claim 1, wherein the phosphor layer comprises a first phosphor which is stacked on a top of an LED corresponding an R sub-pixel from among the plurality of LEDs, and emits light comprising an R component, and a second phosphor which is stacked on a top of an LED corresponding to a G sub-pixel from among the plurality of LEDs, and emits light comprising a G component.

6. The LED apparatus of claim 5, wherein the plurality of color filters comprises a first color filter which is stacked on a top of the first phosphor, a second color filter which is stacked on a top of the second phosphor, and a third color filter which is formed on a top of an LED corresponding to a B sub-pixel from among the plurality of LEDs.

7. The LED apparatus of claim 1, wherein the phosphor is configured to correspond to an R sub-pixel and a G sub-pixel from among the plurality of LEDs, and emit light comprising an R component and a G component,
    wherein the LED apparatus further comprises a blue cut filter which is disposed on a region of the G sub-pixel between the phosphor layer and the filter layer, and
    wherein the blue cut filter is configured to filter a B component out of light emitted from the phosphor.

8. The LED apparatus of claim 7, further comprising an absorbing dye layer which is disposed on a region of the R sub-pixel between the phosphor layer and the filter layer, and
    wherein the absorbing dye layer is configured to absorb a wavelength component between the R component and the G component in light emitted from the phosphor.

9. The LED apparatus of claim 1, wherein the phosphor is configured to convert light entering from the plurality of LEDs into a wavelength of a corresponding sub-pixel, and disperse the light of the converted wavelength outwardly through an inner dispersing member.

10. The LED apparatus of claim 1, further comprising a partition configured to divide the phosphor layer to prevent inter-phosphor light from being mixed.

11. A method for manufacturing a light emitting diode (LED) apparatus, the method comprising:
    forming an LED layer comprising a plurality of LEDs corresponding to a plurality of sub-pixels;
    stacking, on top of the LED layer, a phosphor layer comprising a phosphor corresponding to at least a part of the plurality of sub-pixels; and
    stacking, on top of the phosphor layer, a filter layer comprising a plurality of color filters corresponding to the plurality of sub-pixels,
    wherein each of the plurality of color filters comprises a plurality of absorption films which are spaced from one another at predetermined intervals to absorb external light and disposed between each of the plurality of color filters corresponding to each of the plurality of sub-pixels respectively, and
    wherein the plurality of color filters are divided by a black matrix.

12. The method of claim 11, further comprising stacking, on tops of the plurality of color filters, a plurality of lenticular lens units,
    wherein each of the plurality of lenticular lens units comprises a plurality of lenticular lenses,
    wherein the plurality of lenticular lenses are arranged to correspond to a plurality of filter regions divided by the plurality of absorption films and to refract the external light toward the plurality of absorption films.

13. The method of claim 11, further comprising forming a blocking layer which comprises a plurality of blocking films connected with the plurality of absorption films in a vertical direction and formed on a top of the filter layer, and
wherein each of the plurality of blocking films is formed on a part of each of a plurality of filter regions, which are divided by the plurality of absorption films, at a predetermined interval to block the external light.

14. The method of claim 13, further comprising stacking, on a top of the blocking layer, a plurality of micro lens units formed to correspond to the plurality of color filters,
wherein each of the plurality of micro lens units comprises a plurality of micro lenses, and
wherein the plurality of micro lenses are arranged to correspond to the plurality of blocking films and to refract the external light toward the plurality of blocking films.

15. The method of claim 11, wherein the stacking the phosphor layer comprises:
stacking, on a top of an LED corresponding an R sub-pixel from among the plurality of LEDs, a first phosphor emitting light comprising an R component; and
stacking, on a top of an LED corresponding to a G sub-pixel from among the plurality of LEDs, a second phosphor emitting light comprising a G component.

16. The method of claim 15, wherein the stacking the filter layer comprises:
stacking a first color filter on a top of the first phosphor;
stacking a second color filter on a top of the second phosphor; and
forming a third color filter on a top of an LED corresponding to a B sub-pixel from among the plurality of LEDs.

17. The method of claim 11, wherein the phosphor is configured to correspond to an R sub-pixel and a G sub-pixel from among the plurality of LEDs, and emit light comprising an R component and a G component,
wherein the method further comprises stacking a blue cut filter which is disposed on a region of the G sub-pixel between the phosphor layer and the filter layer, and
wherein the blue cut filter is configured to filter a B component out of light emitted from the phosphor.

18. The method of claim 17, further comprising stacking an absorbing dye layer which is disposed on a region of the R sub-pixel between the phosphor layer and the filter layer, and
wherein the absorbing dye layer is configured to absorb a wavelength component between the R component and the G component in light emitted from the phosphor.

19. The method of claim 11, wherein the phosphor is configured to convert light entering from the plurality of LEDs into a wavelength of a corresponding sub-pixel, and disperse the light of the converted wavelength outwardly through an inner dispersing member.

* * * * *